United States Patent [19]

Keren

[11] Patent Number: 4,689,562
[45] Date of Patent: Aug. 25, 1987

[54] NMR IMAGING METHOD AND SYSTEM
[75] Inventor: Hanan Keren, Rehovot, Israel
[73] Assignee: Elscint Ltd., Haifa, Israel
[21] Appl. No.: 541,007
[22] Filed: Oct. 11, 1983
[51] Int. Cl.⁴ .......................................... G01R 33/20
[52] U.S. Cl. .................................... 324/307; 324/309
[58] Field of Search ..................... 324/307, 312, 77 B, 324/309; 364/415, 414, 575

[56] References Cited

U.S. PATENT DOCUMENTS

| | | | |
|---|---|---|---|
| 3,475,680 | 10/1969 | Anderson | 324/312 |
| 3,622,765 | 11/1971 | Anderson | 364/575 |
| 3,873,909 | 3/1975 | Ernst | 324/312 |
| 4,070,708 | 1/1978 | Smallcombe | 324/307 |
| 4,191,919 | 3/1980 | Haney | 324/307 |
| 4,291,271 | 9/1981 | Lauffer | 324/303 |
| 4,300,096 | 11/1981 | Harrison | 324/309 |
| 4,315,216 | 2/1982 | Clow et al. | 324/309 |
| 4,321,537 | 3/1982 | Yokokawa | 324/307 |
| 4,424,488 | 1/1984 | Hounsfield | 324/309 |
| 4,471,306 | 9/1984 | Edelstein et al. | 324/309 |
| 4,509,015 | 4/1985 | Ordidge et al. | 324/309 |
| 4,527,124 | 7/1985 | van Uijen | 324/309 |
| 4,539,518 | 9/1985 | Kitayoshi | 324/77 B |
| 4,588,948 | 5/1986 | Mansfield | 324/309 |

OTHER PUBLICATIONS

Schwartz–Information, Transmission, Modulation and Noise–1959, pp. 122–131.

Primary Examiner—Stewart J. Levy
Assistant Examiner—Scott M. Oldham
Attorney, Agent, or Firm—Sandler & Greenblum

[57] ABSTRACT

An improved NMR imaging system that minimizes truncated time function generated artifacts on a real time basis by selecting sampling points on the FID generated signals either as a function of a varying magnetic field gradient or at varying sampling intervals.

10 Claims, 8 Drawing Figures

NMR IMAGING METHOD AND SYSTEM

FIELD OF INVENTION

This invention is concerned with signal processing for image enhancement and more particularly to such processing used in obtaining NMR-derived images.

BACKGROUND OF INVENTION

Signal processing to enhance images provided by detected signals requires certain assumptions and steps which inherently cause artifacts in the image. For example, where Fourier transforms are used to process the detected signals, artifacts appear in the images. More particularly, the density profile will include top corner spikes and ripple along the top of the profile. In addition, there will be a slope artifact on what are truly vertical lines. These artifacts are caused by the limitations placed on the range of the integral of the function, i.e., using time-truncated functions. The artifacts can confuse the clinical use of the images by either masking actual tissue problems or by falsely leading the clinician to suspect tissue problems where none exist.

In the past, filters and filtering schemes have been used in attempts to minimize the artifacts. The prior art filters and filter schemes succeed in removing the artifacts but they also remove actual object parts that may resemble the artifacts, thereby seriously adversely affecting the fidelity of the image. The prior art filters and filter schemes in the NMR field used to correct the artifacts caused by using time truncated functions have been of the post-acquisition type. Thus, to date there are no known methods or apparatus for removing the artifacts described without also removing actual physically inspired data from the collected data. Also, there is no known time truncated function-caused artifact correction scheme operating in real time in an on-line manner.

Accordingly, it is an object of the present invention to operate on-line to minimize certain artifacts. The artifacts corrected by the present invention are those caused by time-truncated functions which are used, based on assumptions necessary to the mathematical construction of the image from the acquired data. According to the present invention, the artifact minimization is accomplished without removing actually detected data and therefore without degrading the fidelity of the image.

BRIEF DESCRIPTION OF THE INVENTION

According to a broad aspect of the invention an improved NMR imaging method is provided, the improved method minimizes inherent artifacts in the images of objects obtained by magnetic resonance techniques, said method comprises the steps of:
(a) subjecting the object to a first magnetic field;
(b) applying a second magnetic field substantially perpendicular to the first magnetic field and rotating at the Larmor frequency;
(c) removing the second magnetic field after a certain period of time;
(d) applying at least one magnetic field gradient to said first magnetic field;
(e) detecting FID (free induction decay) signals generated during the application of said magnetic field gradient;
(f) sampling the detected FID signals; and
(g) processing the sampled FID signals on-line to minimize inherent artifacts in the image obtained from the processed signals while substantially maintaining the fidelity of the detected FID signals.

A feature of the invention uses non-linear magnetic field gradients. That is, the gradient is not a constant but instead preferably is a varying function.

According to another feature of the invention, the sampling of the detected FID is done at intervals which are not constant but vary as a function of a characteristic such as time, phase or frequency.

BRIEF DESCRIPTION OF THE DRAWINGS

The above-mentioned and other features and objects of the invention will be best understood by reading the following description of certain aspects of the invention taken in conjunction with the followng drawings wherein.

GENERAL DESCRIPTION

Figure 1:
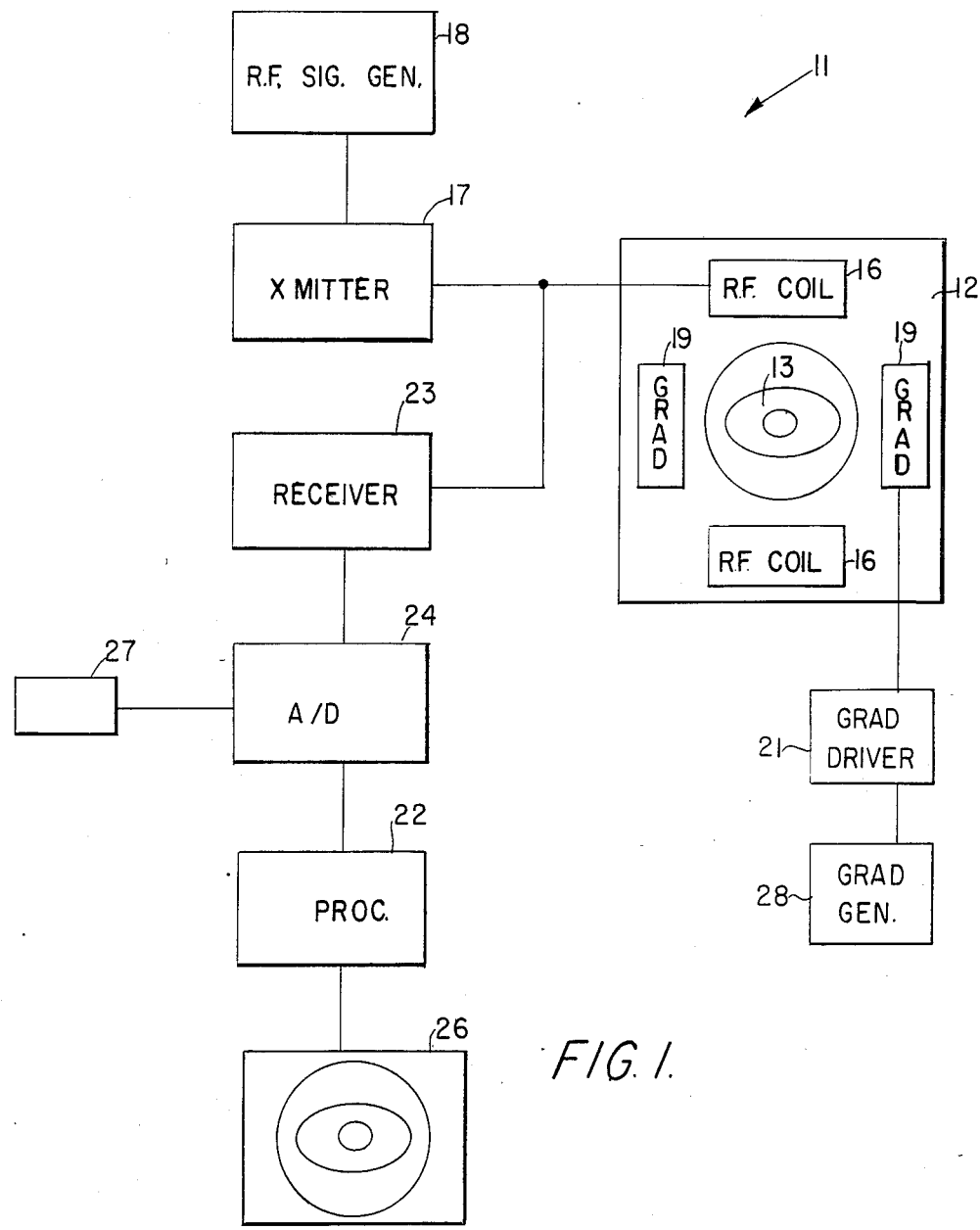
FIG. 1 is a block diagram showing of a typical NMR imaging system.

The typical NMR imaging system 11 of FIG. 1 is shown as including a magnet 12 large enough to receive therein an object such as a patient 13. The magnet is shown as having a power supply for providing magnetizing current which causes the magnetization. It should be understood that regardless of what is shown in the figure the invention contemplated herein is of sufficient scope to apply to all types of magnetization systems that may be used in NMR imaging systems.

The object 13 is subjected to a magnetic field Bo directed into the plane of the paper. A rotating magnetic field is generated by the radio frequency coil 16 when the coil is energized by a radio frequency signal received from the transmitter 17. The transmitter receives the RF signal from generator 18. The field generated by the RF coil is in the plane of the paper or parallel thereto, and accordingly is substantially normal to the magnetic field Bo.

In a manner well known to those skilled in the art, the main magnet's field is supplied with gradients by gradient coils 19 powered from the gradient driver 21. A processor or computer 22 supervises the units specified, although for purposes of clarity the connecting conductors between the processor 22 and the magnetic field generating and control units are are not shown.

The radio frequency coil 16 also detects the FID signals generated when the power to the RF coil is removed. The FID signals are processed in computer or processor 22 after being converted to digital signals in analog to digital unit 24. The FID signals are typically detected in the time domain and converted to the frequency domain using Fourier transforms. A plurality of FIDS are combined to form images displayed on display unit 26.

Sampling according to a non-linear pattern is provided to remove or at least minimize the truncated time function generated artifacts inherent to the image generation process, such as the corner spikes and the top ripple present in the image density profile. The means enable the FID signals to be sampled according to a certain pattern that is not linear. More particularly, in accordance with one embodiment of the invention, the non-linear sampling of the FID signals is accomplished with an A/D converter equipped with a sampling function generator 27. The function generator provides non-linear sampling intervals and thereby assures that the points of the FID signal sampled for conversion to digital data are not points that are equally spaced from each other on the absissa of the analog function. The absissa can be designated in units of domain such as time, phase, or frequency.

The same artifact minimizing effect can be obtained by using a gradient during the FID signal detecting period (observed gradient) that varies instead of using the constant gradient used in the prior art. In a preferred embodiment of the invention the observed gradient is not constant in time during the observation period. The means for causing the gradient to vary are shown in FIG. 1 as gradient function generator unit 28. Whether the sampling interval is varied or the gradient used during the time that the FID is observed, is varied, the result is a variation in the data used to provide the final image. The remaining figures provide an indication of the fidelity of the images after correction to remove artifacts.

Figure 2:
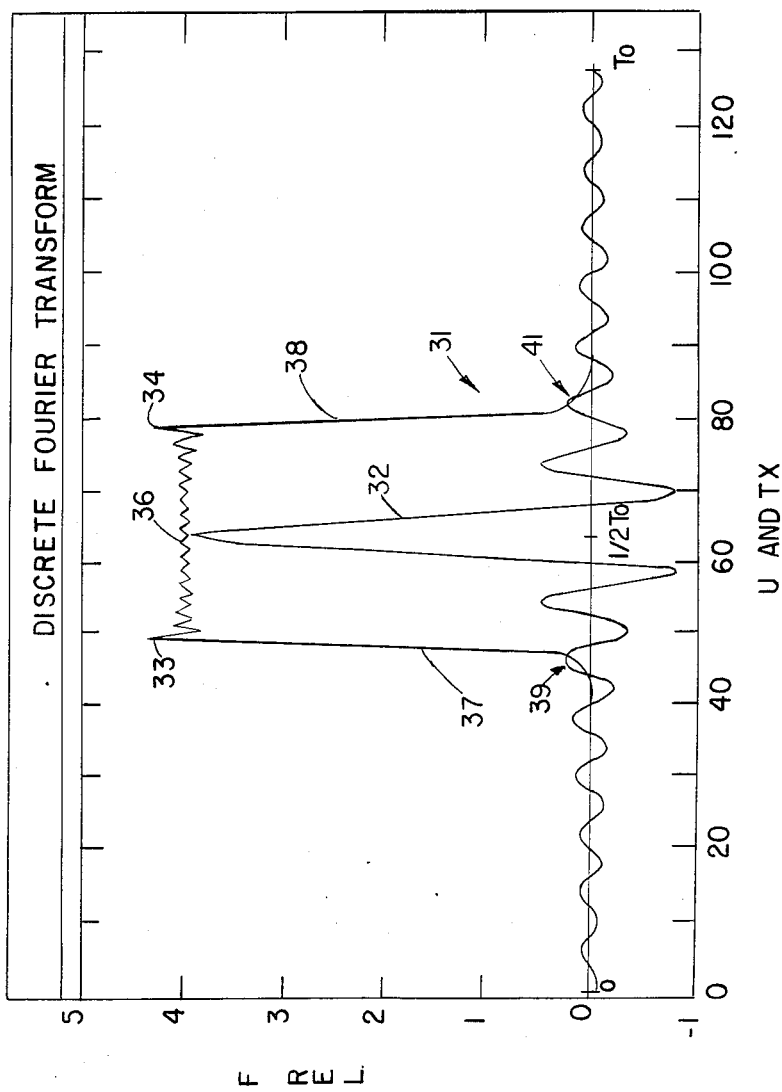
FIG. 2 is a combined diagramatic showing of a Fourier transform obtained density profile of a rectangular object and an FID signal in the time domain.

FIG. 2 is an image of the density profile of a rectangular phantom superimposed on the time domain depicted FID signals 32 representative of the phantom. The FID signals are shown in the time domain and the density profile is shown in the frequency domain. The artifacts are clearly seen in FIG. 2. Note the corner spikes 33, 34 and the top ripple 36. In addition, the sides of the density profile 37 and 38 slope toward the center instead of being truly vertical. Also, there are flaring skirt sections 39 and 41 at the bottoms of side 37 and 38 respectively which are not truly representative of the phantom.

FIG. 2 was obtained as was done in the prior art, with a constant gradient, i.e. dG/dt=o, dG/dx=o and with FID sampling points at constant sampling intervals.

Figure 3:
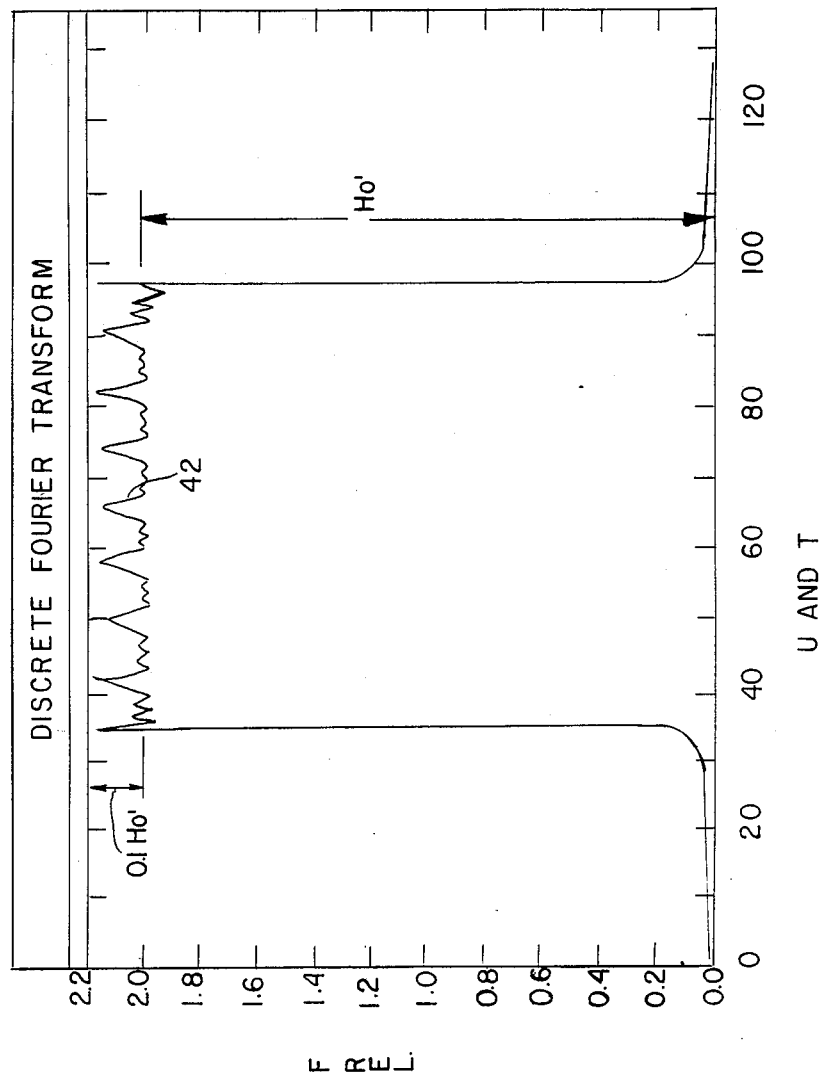
FIG. 3 is a showing of the density profile of the phantom object shown in FIG. 4.
Figure 4:
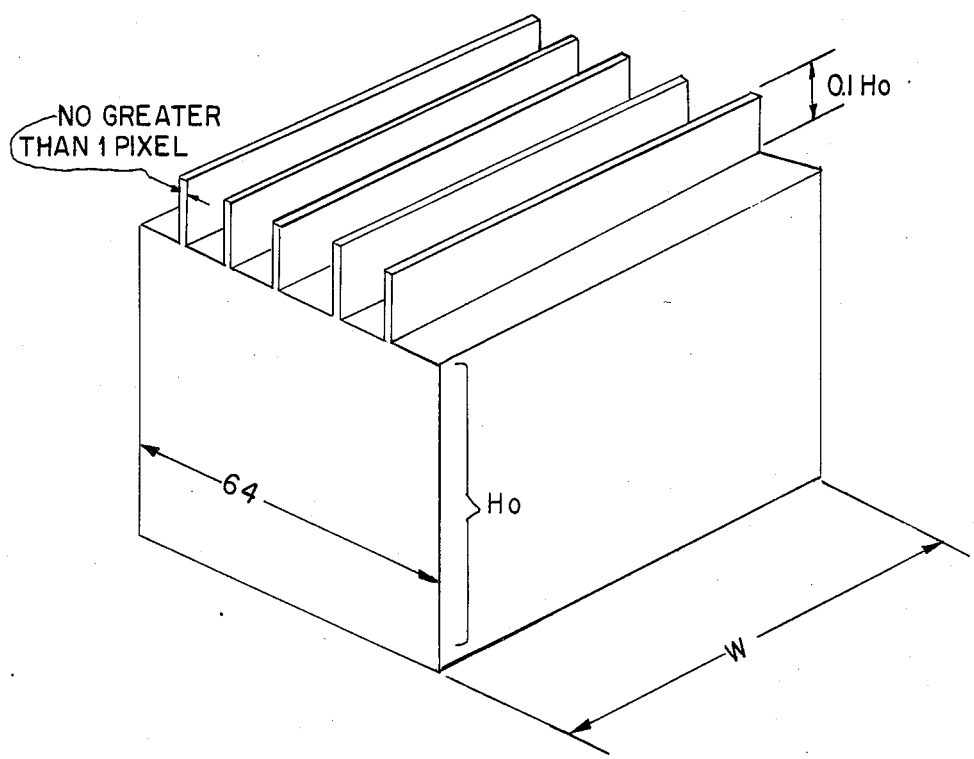
FIG. 4 is a pictorial showing of the phantom of FIG. 3

FIGS. 3 and 4 illustrate and emphasize the problems created by the artifacts described in connection in FIG. 2. The phantom is shown in FIG. 4 and comprises a rectangular cube unit that is 64 pixels wide. On the top of the phantom are seven spikes, each 10% of the original height Ho of the phantom. The spikes have a rectangular cross-section and are each no wider than 1 pixel. The image profile of FIG. 3 depicts the seven spikes such as spikes 42—but in the image the spikes are less than 10% of the original height Ho of the block. The spike width in the image varies from base to the tops thereof, so that they appear to have triangular cross-sections. The corner spikes which are artifacts cannot be objectively distinguished from the real spikes.

Figure 5:
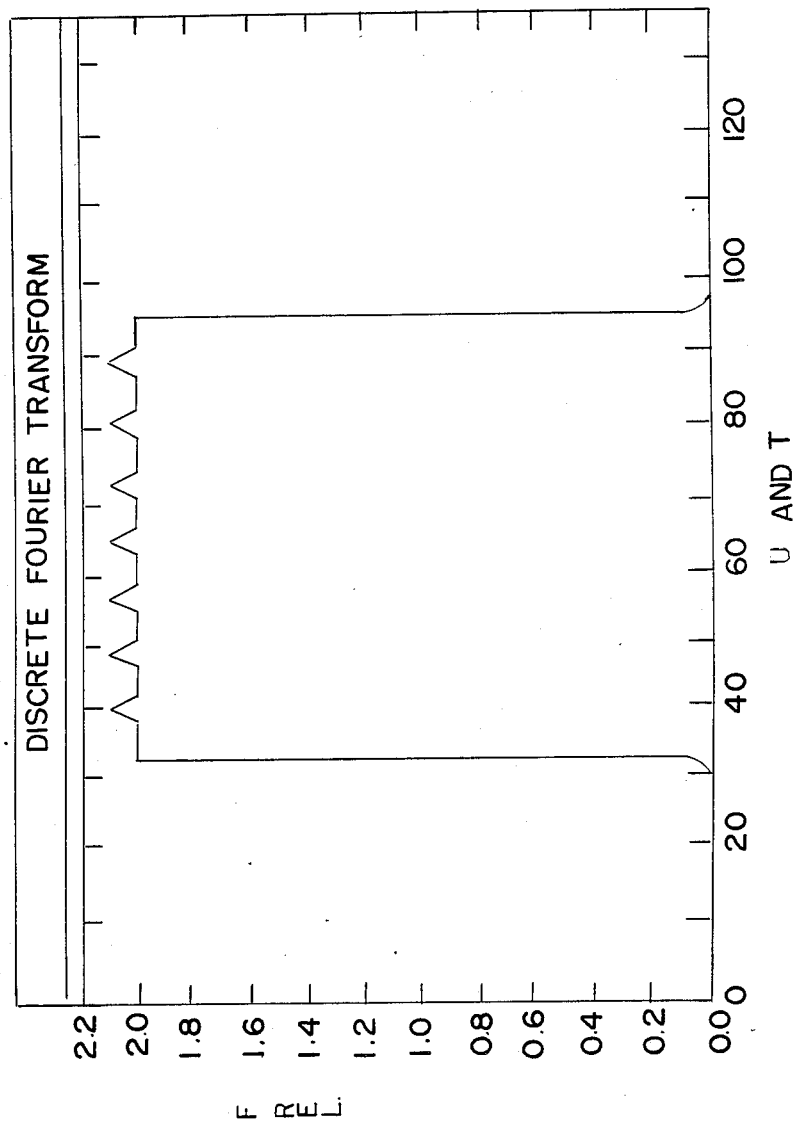
FIG. 5 is a showing of the profile of the object of FIG. 4 after post-acquisition filtering with a prior art filter.

FIG. 5 shows the image when a prior art post-acquisition correcting filter is used. In this case the prior art filter was a sine filter. The filter is applied when processing the FID data in a manner well known to those skilled in the art. Note that the corner spikes are gone but that the images of the real spikes have each decreased in height and increased in width, especially at and near the base—giving the images of the rectangular spikes a definite triangular shape. Also, note that there still is some—although a reduced amount of—flare at the bottom of the image. The prior correcting filters operate on the data in a post-acquisition manner, i.e. not in a real time on-line basis. Thus the corrections are not obtained during the actual test time. Also, the prior art filters are non-selective, operating on all sections of the displayed image equally.

Figure 6:
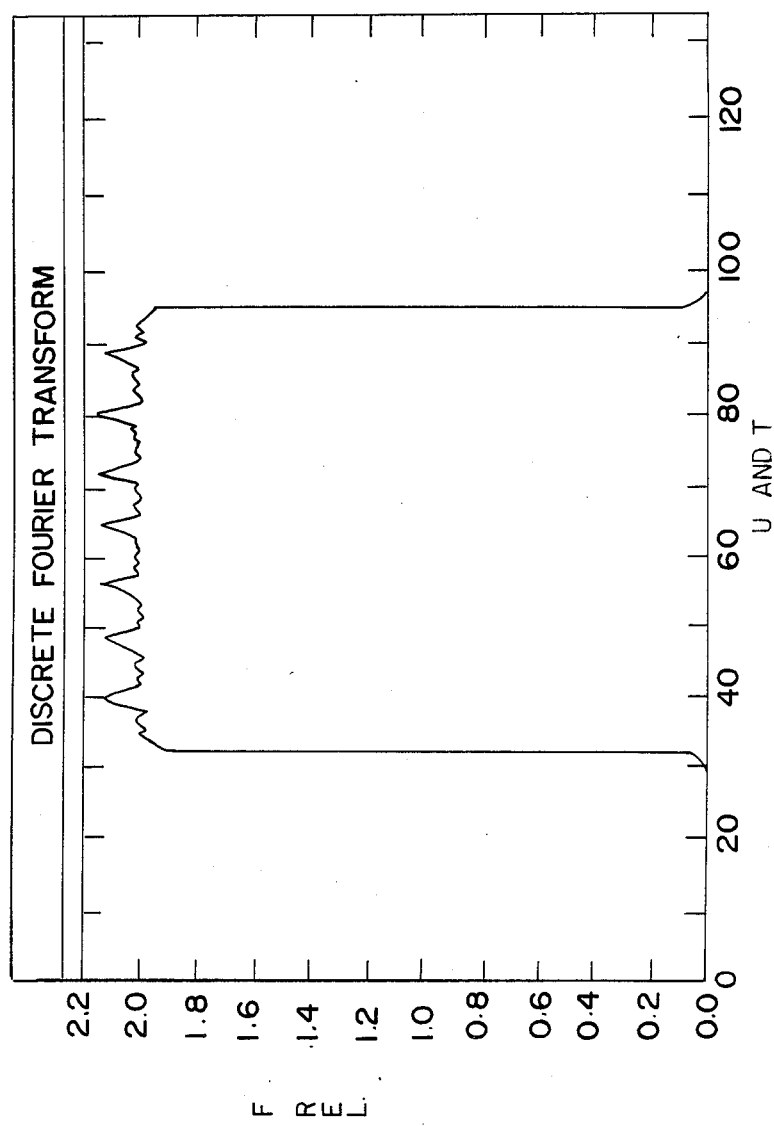
FIG. 6 is a showing of the profile of the object corrected in accordance with this invention in an on-line, real time manner.

FIG. 6 is the image using the inventive methods and means. The corner spikes have been eliminated. The real spikes are shown as about 0.1 of Ho and almost of the width of the real spikes at their bottoms. The flare at the bottom of the image is practically non-existent. FIG. 6 was generated using varying sampling intervals in an on-line manner. Further, note that the inventive method is selective; for example, the re solution in FIG. 6 is better in the center of the image than at the ends. This selectivity can be used when examining desired regions of interest.

In operation then, the image is derived either using a gradient function generator which assures that the gradient is not constant or a signal sampling function generator to obtain the FID samples at points that are not spaced equidistantly according to the absissa of an FID amplitude versus time, phase or frequency function.

Figure 7:
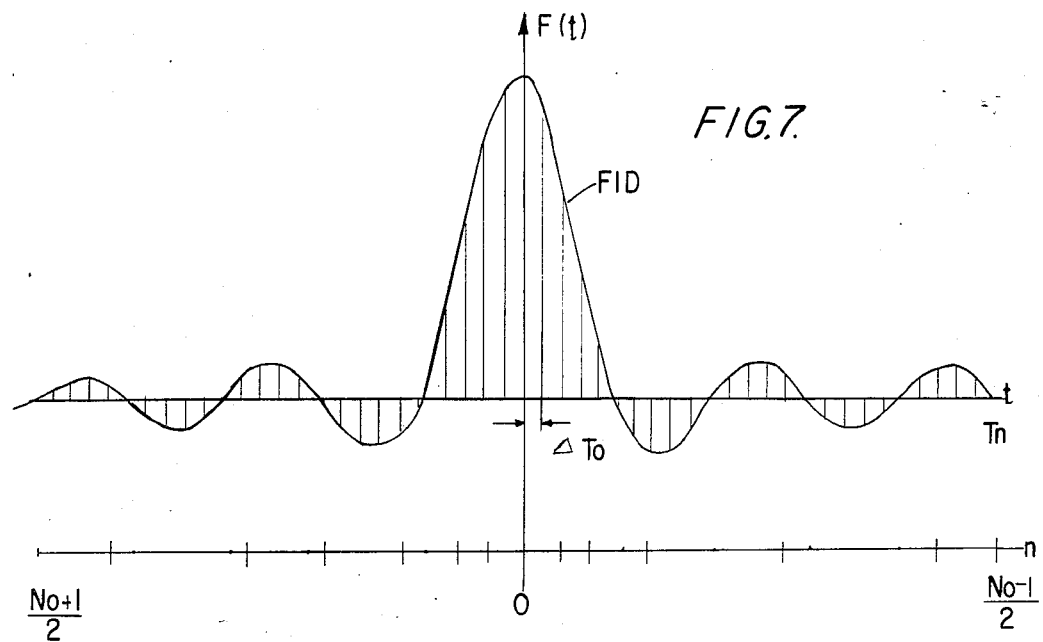
FIG. 7 is a graphical showing of the variable sampling intervals applied to typical FID signals.
Figure 8:
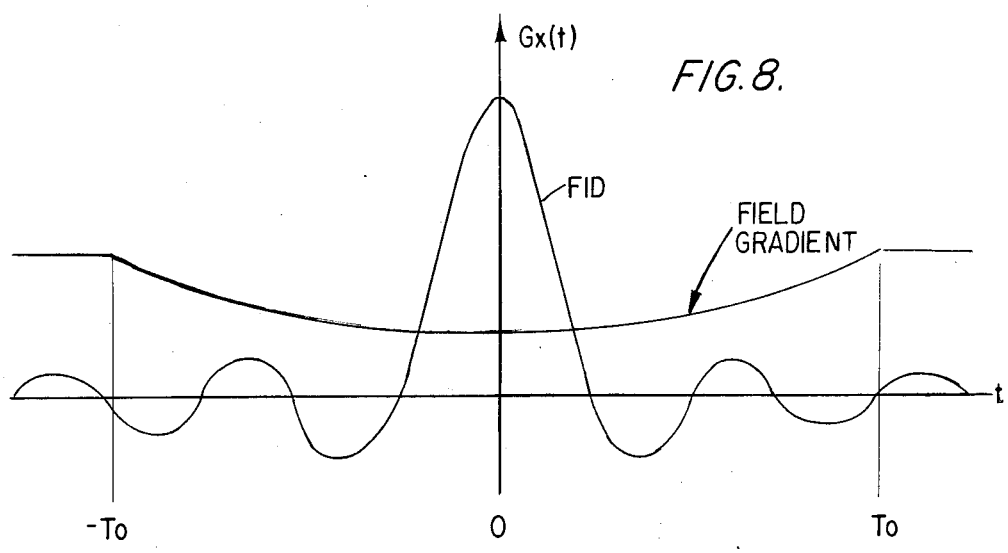
FIG. 8 is a graphical showing of a non-linear field gradient superimposed on typical FID signals.

FIG. 7 shows a preferred sampling time interval function and FIG. 8 shows a preferred gradient function in accordance with the invention. Further, the sampling interval function or the gradient function provide on line artifact correction with selectivity.

In the prior art, the sampling intervals and the gradients are constant. This invention contemplates using either variable sampling intervals as shown in FIG. 7 or variable gradients as shown in FIG. 8 to correct the truncated time function caused artifacts in an on line basis. This artifact correction procedure replaces the prior art filters used on a post acquisition basis and is more effective in correcting the noted artifacts than are the filters of the prior art.

A typical variable sample interval in accordance with this invention is:

$$\Delta Tn = \Delta To \left[ 1 + C \left( \frac{2n}{No} \right)^\alpha \right]$$

where:
  Tn is the variable sampling interval,
  To is the basic sampling interval,
  n is the particular sampling point, i.e. 64, −63 ... −1, 0, 1, 2 ... 63
  $\alpha$ is a constant,
  No is the total number of sampling points, i.e. 128 and
  C is a constant; in the prior art C=0.
  where for the case of No=$2^7$, C<0 for −64≦n<0, and C0 for 0≦n≦63

A typical variable magnetic field gradient in accordance with this invention is: $Gx(t) = Go[1 + 1t/To \, 1^{\alpha}*C]$
where:
  Gx is the observed gradient in the X direction,
  Go is the basic gradient, and α is a constant;
t is the time at the particular point on the graph of FIG. 8
where t extends from —To to +TO and t=o at center of the FID signal when the
FID signal is maximum.
C is a constant; in the prior art C=0.

While the invention has been described in accordance with preferred embodiments of the invention it should be understood that this description is by way of example, and in no way limits the invention to the embodiments described, but instead the invention is defined by the appended claims.

What is claimed is:

1. An improved MR imaging method for minimizing truncated time function generated artifacts found in images of objects obtained when using nuclear magnetic resonance procedures, said method comprising the steps of:
   (a) subjecting an object a large static magnetic field;
   (b) applying a radio frequency (RF) magnetic field perpendicular to said static magnetic field and rotating at a Larmor frequency;
   (c) removing the RF magnetic field after a fixed time period to enable the generation of output signals;
   (d) applying at least one field gradient pulse to said static magnetic field;
   (e) detecting the output signals generated during the application of the said field gradient pulse; and
   (f) sampling the output signals according to a non-linear pattern while maintaining said at least one field gradient pulse constant.

2. An improved NMR imaging system for minimizing time truncated time function generated artifacts found in images obtained using NMR procedures, said system comprising:
   (a) means for subjecting an object to a large static magnetic field;
   (b) means for applying a radio frequency (RF) magnetic field rotating at a Larmour frequency and perpendicular to said large static magnetic field;
   (c) means for removing the RF magnetic field after a fixed period to enable the generation of output signals;
   (d) means for applying at least one magnetic field gradient to said first static field,
   (e) means for detecting output signals generated during the application of said field gradient; and
   (f) means for sampling the output signals at variable sampling intervals while maintaining said at least one magnetic field gradient constant.

3. An improved NMR imaging method for minimizing truncated time function generated artifacts found in images of objects obtained when using nuclear magnetic resonance procedures, said method comprising the steps of:
   (a) subjecting an object to a large static magnetic field;
   (b) applying a radio frequency (RF) magnetic field having a Larmor frequency perpendicular to said static magnetic field;
   (c) removing the RF magnetic field after a fixed time period to enable the generation of output signals;
   (d) applying at least one field gradient pulse to said static magnetic field;
   (e) detecting the output signals generated during the application of the said field gradient pulse;
   (f) sampling the output signals; and
   (g) said sampling step including varying the magnetic field gradient non-periodically while maintaining a constant sampling interval to obtain output signals which provide images with minimum time truncated function generated artifacts without reducing the fidelity of the image.

4. An improved NMR imaging method for minimizing truncated time function generated artifacts found in images of objects obtained when using nuclear magnetic resonance procedures, said method comprising the steps of:
   (a) subjecting an object to a large static magnetic field;
   (b) applying a radio frequency (RF) magnetic field having a Larmor frequency perpendicular to said static magnetic field;
   (c) removing the RF magnetic field after a fixed time period to enable the generation of output signals;
   (d) applying at least one field gradient pulse to said static magnetic field;
   (e) detecting the output signals generated during the application of said field gradient pulse; and
   (f) sampling the output signals by varying the sampling interval between the measured points of the FID signals while maintaining the magnetic field gradient constant.

5. An improved NMR imaging method for minimizing truncated time function generated artifacts found in images of objects obtained when using nuclear magnetic resonance procedures, said method comprising the steps of:
   (a) subjecting an object to a large static magnetic field;
   (b) applying a radio frequency (RG) magnetic field having a Larmor frequency perpendicular to the static magnetic field;
   (c) removing the RF magnetic field after a fixed time period to enable the generation of output signals;
   (d) applying at least one magnetic field gradient pulse, said magnetic field gradient pulse being a varying magnetic field gradient pulse, defined as follows:

$$Gx(t) = Go(1 + |Ct/To|^{\alpha})$$

where:
   Go is the basic magnetic field gradient,
   Gx is the varying gradient in the X direction,
   α is a constant,
   To is the total time having either a positive or a negative direction,
   t is a particular point of the time function of the output signal, varying between —To and To, and
   C is a constant and is not equal to 0;
   (e) detecting the output signals generated during the application of said magnetic field gradient pulse, and
   (f) sampling the output signals.

6. An improved NMR imaging method for minimizing truncated time function generated artifacts found in images of objects obtained when using nuclear resonance procedures, said method comprising the steps of:
   (a) subjecting an object to a large static magnetic field;
   (b) applying a radio frequency (RF) magnetic field having a Larmor frequency perpendicular to said static magnetic field;

(c) removing the RF magnetic field after a fixed time period to enable the generation of output signals;
(d) applying at least one magnetic field gradient pulse to said static magnetic field;
(e) detecting the output signals generated during the application of said field gradient pulse; and
(f) sampling the detected output signals at variable sampling intervals while maintaining said field gradient constant, said varying sampling intervals defined as follows:

$$Tn = To[1 + C(2n/No)^\alpha]$$

where:
Tn is the variable sampling interval,
To is the basic sampling interval,
n is a particular sampling point; i.e., $-64, -63, \ldots, -1, 0, 1, 2 \ldots 63$,
No is a total number of sampling points; i.e. 128,
$\alpha$ is a constant,
C is a constant not equal to zero, and
C<0 for $-64 \leq n \leq 0+$,
C>0 for $0 \leq n \leq 63$.

7. An improved NMR imaging method for minimizing truncated time function generated artifacts found in images or objects obtained when using nuclear magnetic resonance procedures, said method comprising the steps of:
(a) subjecting an object to a large static magnetic field;
(b) applying a radio frequency (RF) magnetic field perpendicular to said static magnetic field and rotating at a Larmor frequency;
(c) removing the RF magnetic field after a fixed time period to enable the generation of output signals;
(d) applying at least one magnetic field gradient pulse to said static magnetic field;
(e) detecting the output signals generated during the application of said at least one magnetic field gradient pulse; and
(f) sampling the output signals;
(g) said sampling step including varying the field integral for the magnetic field gradient pulse to obtain samplings of such output signals which provide the image with minimum time truncated function generated artifacts while maintaining the fidelity of the image.

8. An improved NMR magnetic system for minimizing truncated time function generated artifacts found in images obtained using NMR procedures, said system comprising:
(a) means for subjecting an object to a large static magnetic field;
(b) means for applying a radio frequency (RF) magnetic field rotating at a Larmour frequency and perpendicular to said large static magnetic field;
(c) means for removing the RF magnetic field after a fixed period to enable the generation of output signals;
(d) means for applying at least one magnetic field gradient to said first static field;
(e) means for detecting output signals generated during the application of said field gradient;
(f) means for sampling the output signals; and
(g) means for varying the applied magnetic field gradient non-periodically while maintaining the sampling interval constant.

9. An improved NMR imaging system for minimizing truncated time function generated artifacts found in images obtained using NMR procedures, such system comprising:
(a) means for subjecting an object to a large static magnetic field;
(b) means for applying a radio frequency (RF) magnetic filed perpendicular to said large static magnetic field and rotating at a Larmor frequency;
(c) means for removing the RF magnetic field after a fixed period output to enable the generation of output signals;
(d) means for applying at least one magnetic field gradient to said static field;
(e) means for detecting output signals generated during the application of said at least one magnetic field gradient;
(f) means for sampling the output signals; and
(g) means for non-periodically varying the applied magnetic field gradient parabolically.

10. An improved NMR imaging system for minimizing truncation time function generated artifacts found in images obtained using NMR procedures, said system comprising:
(a) means for subjecting an object to a large static magnetic field;
(b) means for applying a radio frequency (RF) magnetic field perpendicular to said large static magnetic field and rotating at a Larmor frequency;
(c) means for removing the RF magnetic field after a fixed period to enable a generation of output signals;
(d) means for applying at least one magnetic field gradient to said static field;
(e) means for detecting output signals generated during the application of said at least one magnetic field gradient; and
(f) means for sampling the output signals at sampling intervals that vary parabolically.

* * * * *